(12) United States Patent
Veenker

(10) Patent No.: US 9,722,379 B2
(45) Date of Patent: Aug. 1, 2017

(54) SYSTEM FOR QUICK-MOUNT ELECTRICAL COMPONENTS

(71) Applicant: Darren Veenker, Hillsboro, OR (US)

(72) Inventor: Darren Veenker, Hillsboro, OR (US)

(*) Notice: Subject to any disclaimer, the term of this patent is extended or adjusted under 35 U.S.C. 154(b) by 19 days.

(21) Appl. No.: 14/946,391

(22) Filed: Nov. 19, 2015

(65) Prior Publication Data

US 2017/0149187 A1   May 25, 2017

(51) Int. Cl.
| | |
|---|---|
| *H02B 1/00* | (2006.01) |
| *H02B 1/18* | (2006.01) |
| *H02B 1/30* | (2006.01) |
| *H01R 33/06* | (2006.01) |
| *F21V 23/02* | (2006.01) |

(52) U.S. Cl.
CPC .......... *H01R 33/06* (2013.01); *F21V 23/026* (2013.01)

(58) Field of Classification Search
CPC ............................ H01R 33/06; F21V 23/026
USPC ................ 361/601, 602, 622, 627, 641, 674
See application file for complete search history.

(56) References Cited

U.S. PATENT DOCUMENTS

| | | | |
|---|---|---|---|
| 4,719,540 | A | 1/1988 | San George et al. |
| 5,367,229 | A | 11/1994 | Yang |
| 5,600,537 | A | 2/1997 | Gordin et al. |
| 5,691,878 | A | 11/1997 | Ahn et al. |
| 6,488,386 | B1 | 12/2002 | Yan |
| 6,979,097 | B2 | 12/2005 | Elam et al. |
| 7,282,840 | B2 | 10/2007 | Chih |
| 7,830,649 | B2 | 11/2010 | Yang |
| 7,965,494 | B1 | 6/2011 | Morris et al. |
| 8,201,965 | B2 | 6/2012 | Yamada et al. |
| 2008/0169768 | A1 | 7/2008 | Yang |
| 2013/0095689 | A1 | 4/2013 | Hayman et al. |

*Primary Examiner* — Anthony Haughton
(74) *Attorney, Agent, or Firm* — Mohr Intellectual Property Law Solutions, PC

(57) ABSTRACT

Quick-mount electrical components including a body and a receiver. The body includes a first protrusion, a connecting portion distal the first protrusion, the connecting portion containing a first set of one or more electrical contacts, and a second protrusion proximate the connecting portion. The receiver includes a guide, a wire trap proximate the guide, a receiving portion distal the guide, the receiving portion containing a second set of one or more electrical contacts, and a retainer proximate the receiving portion. The first protrusion has one or more recesses that match corresponding alignment elements on the guide such that the body is keyed to only fit certain receivers, depending upon the electrical characteristics of devices wired to the receiver.

20 Claims, 8 Drawing Sheets

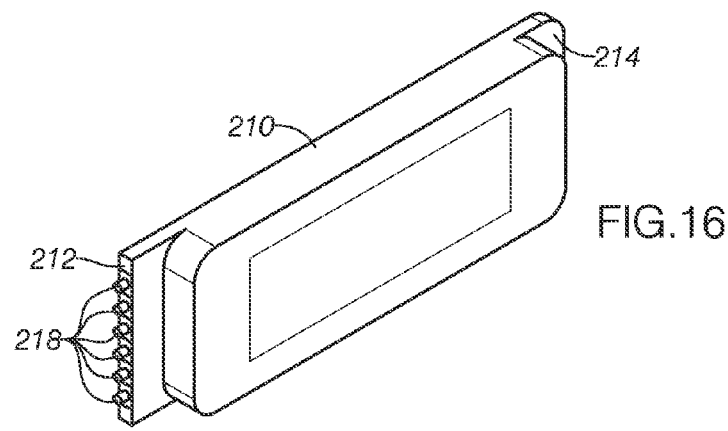
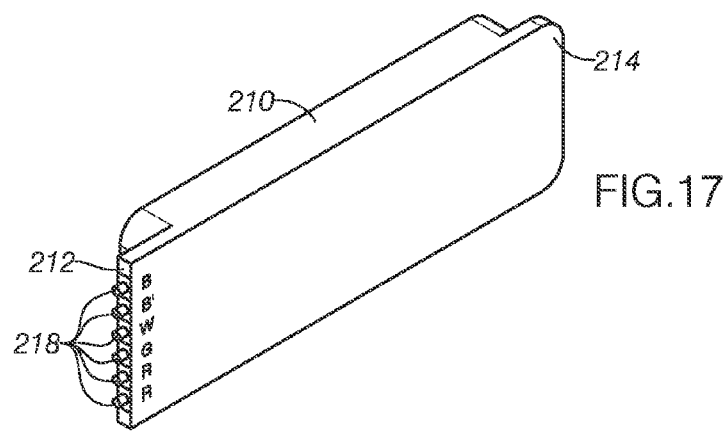
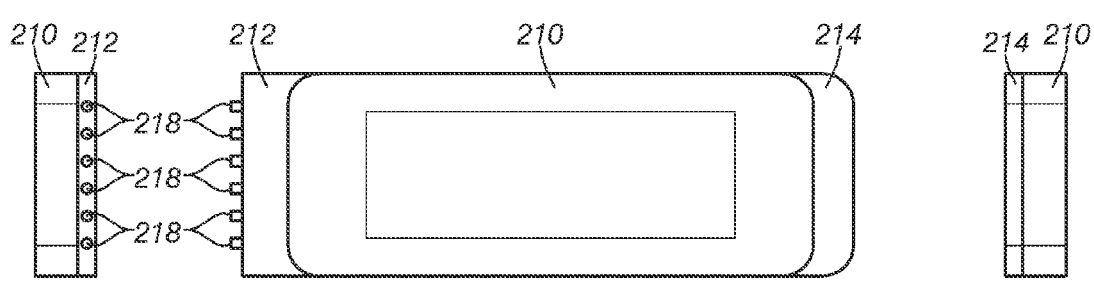
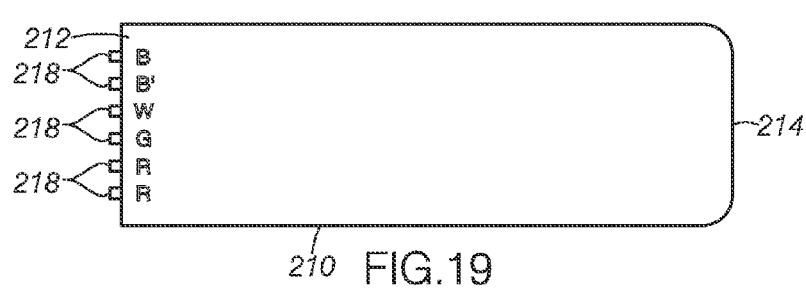

SYSTEM FOR QUICK-MOUNT ELECTRICAL COMPONENTS

CROSS REFERENCE TO RELATED APPLICATIONS

This application claims priority to and is a continuation-in-part of copending U.S. application Ser. No. 14/155,219, filed on Jan. 14, 2014, which is hereby incorporated by reference for all purposes. U.S. patent application Ser. No. 14/155,219 claims priority to and the benefit under 35 U.S.C. §119(e) of U.S. Application, Ser. No. 61/752,222, filed on Jan. 14, 2013, which is hereby incorporated by reference for all purposes.

BACKGROUND

The present disclosure relates generally to electrical components for supplying and regulating power. In particular, quick-mount systems for electrical components are described.

Known systems for mounting electrical power components are not entirely satisfactory for the range of applications in which the) are employed. For example, replacing existing failed electrical power components can be labor intensive; cutting and splicing wires demands knowledge of electrical circuits, time, and labor.

Electrical power components are required in a wide variety of applications. For example, electrical components are required to limit the flow of electrical current in a light fixture for arc-type lamps, such as fluorescent, high or low pressure sodium, metal halide, xenon, or any other type of lamp that experiences a resistance decrease, and commensurate current increase, as it heats. Power supplies are typically required for the increasingly popular LED lamp, which often requires a low voltage direct current supply, with current limiting abilities. A power supply thus transforms and rectifies line power, which is high voltage alternating current. Similarly, low voltage lighting that is popular in landscape lighting and small accent lights requires a power supply for lowering line voltages of 120 VAC or higher to 12-24 VAC. Still further, many of today's networking components require power supplies to provide low voltage DC. Network components such as routers and WiFi hotspots may be permanently mounted in various locations in a building, and require a power adapter in dose proximity that is preferably installed along with the network component.

The aforementioned electrical power components are subject to degradation and failure over time, as components age and undergo repeated cycles of expansion and contraction. Replacing existing installed electrical components may require cutting existing wires that connect the defective component to its associated lamp fixture or electronic device, and splicing the cut wires to a replacement electrical power component. Performing these replacements can be a time-consuming and confusing task for those not versed in replacing electrical components. In some instances, removing and replacing existing electrical power components generally requires the skill and knowledge of a professional electrician.

In addition, many conventional electrical power components are not modularly configured. Replacing a defective conventional electrical power component thus requires replacing the entire component when the assembly ceases to function properly. Because conventional electrical power components must be completely removed as an entire unit each time they cease to function properly, replacement often includes unscrewing or otherwise undoing the mountings of the electrical power component, and remounting the new component. Remounting may be complicated if the new component does not share a common mounting method or identically placed screw holes. Indeed, there is no simple method of quickly removing and replacing a defective electrical power component with a properly functioning plug-and-play or modular-type electrical power component.

Thus, there exists a need for quick-mount electrical power components that improve upon and advance the design of known electrical power components. Examples of new and useful quick-mount electrical components relevant to the needs existing in the field are discussed below.

SUMMARY

The present disclosure is directed to quick-mount electrical components including a body and a receiver. The body includes a first protrusion, a connecting portion distal the first protrusion, the connecting portion containing one or more electrical contacts, and a second protrusion proximate the connecting portion. The receiver includes a guide, a wire trap proximate the guide, a receiving portion distal the guide, the receiving portion containing one or more complementarily configured electrical contacts that correspond to the one or more electrical contacts of the connecting portion, and a retainer proximate the receiving portion.

The guide is configured to receive the first protrusion, the receiving portion is configured to receive the connecting portion, the one or more electrical contacts connect with the complimentarily configured one or more electrical contacts, and the retainer is configured to retain the second protrusion. Retaining the connecting portion in the receiving portion connects the primary plurality of electrical contacts with the secondary plurality of electrical contacts to complete an electrical circuit. In some examples, the quick-mount electrical component includes a connecting portion integrated with an edge of the body. In some further examples, the quick-mount electrical component includes a spring-biased thumb latch retainer.

BRIEF DESCRIPTION OF THE DRAWINGS

FIG. 16 is a top end perspective view of a second example of a quick-mount electrical component body including a connecting portion with an integrated primary plurality of electrical contacts.

FIG. 17 is a bottom end perspective view of the quick-mount electrical component body shown in FIG. 16 depicting a series of depressions containing the primary plurality of electrical contacts.

FIG. 18 is a top elevation view of the quick-mount electrical component body shown in FIG. 16 depicting a protrusion distal from the connecting portion.

FIG. 19 is a bottom elevation view of the quick-mount electrical component body shown in FIG. 16 depicting the series of depressions.

FIG. 20 is a left end elevation view of the quick-mount electrical component body shown in FIG. 16 depicting the primary plurality of electrical contacts.

FIG. 21 is a right end elevation view of the quick-mount electrical component body shown in FIG. 16 depicting the protrusion.

DETAILED DESCRIPTION

Figure 1A:
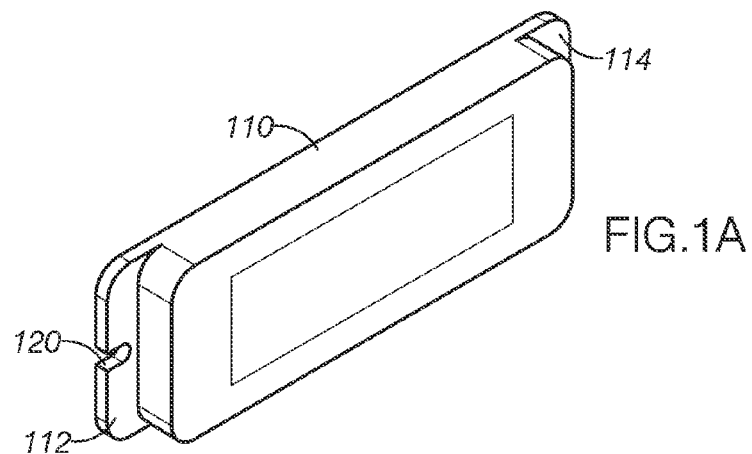
FIG. 1A is a top perspective view of a first example of a quick-mount electrical component body, with a single notch on the first protrusion.

The disclosed quick-mount electrical components will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various quick-mount electrical components are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

With reference to FIGS. 1A-15, a first example of a quick-mount electrical component, quick-mount electrical component 100, will now be described. Quick mount electrical component 100 includes a body 110 and a receiver 130.

Quick-mount electrical component 100 is modularly configured to facilitate or allow rapidly replacing defective electrical power components without confusion. Body 110 contains all electrical components that are typically contained in conventional electrical components. Body 110 mounts within receiver 130 and may be inserted and removed quickly and easily without cutting or splicing electrical wires.

Moreover, receiver 130 can be adapted to mount within an associated electrical device (not shown) such as a lighting fixture or electronic device, or in an installation-appropriate location, such as in the case of low voltage lighting or an LED lighting power supply, in the same manner as existing electrical components. Receiver 130 may be wired directly to standard electrical wires (not shown) of the device either at a factory or after-market to replace conventional electrical components. Body 110 mounts in receiver 130 to complete an electrical circuit. Thus, quick-mount electrical component 100 obviates the need for rewiring typically required when replacing conventional electrical components.

Quick-mount electrical component 100 functions to quickly and efficiently replace defective electrical components without the need to cut or splice wires. In other words, when body 110 ceases to function properly, body 110 can be removed and replaced by a new, properly functioning body quickly and easily. Receiver 130 is configured to fixedly mount within or proximate to the associated device, and the new body snaps into place.

Additionally or alternatively, quick-mount electrical component 100 eliminates the substantial time required to replace conventional electrical components by those not versed in replacing electrical components. Receiver 130 is wired to the associated device once and remains in place when an electrical component needs to be replaced. Replacing a defective or malfunctioning electrical component merely requires removing and replacing body 110.

Thus, quick-mount electrical component 100 offers a substantial improvement over existing electrical components: generally, only body 110 is replaced in a matter of seconds rather than replacing the entire conventional electrical component, which can take hours and requires knowledge of electrical circuits.

As can be seen in FIGS. 1A-6, 14, and 15, body 110 includes a first protrusion 112, a second protrusion 114, a connecting portion 116, a primary plurality of electrical contacts 118, and one or more recesses 120. For ease of illustration, the figures do not depict an internal electrical circuit contained within body 110. The internal electrical circuit may be any electrical circuit suitable for regulating current and/or supplying power to an associated electrical device such as an arc lamp, LED fixture, low voltage lighting, or other electronic component as known in the art.

Figure 1B:
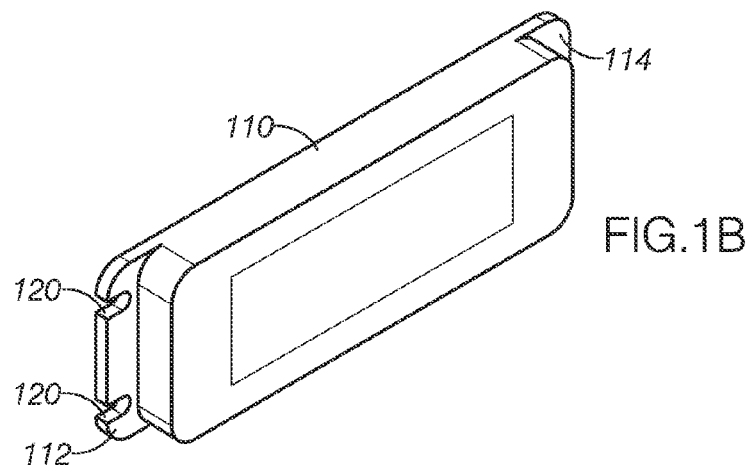
FIG. 1B is a top perspective view of a first example of a quick-mount electrical component body, with two notches on the first protrusion.
Figure 1C:
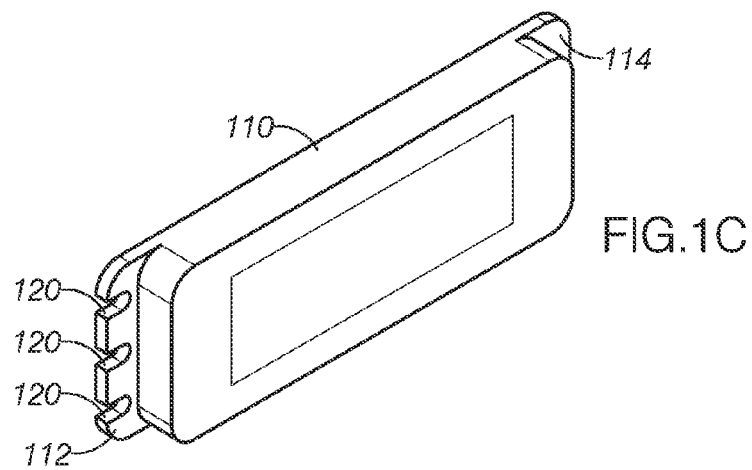
FIG. 1C is a top perspective view of a first example of a quick-mount electrical component body, with three notches on the first protrusion.

As shown in FIGS. 1A-1C, body 110 is low-profile and rectangular. Alternatively, the body may be configured in any size, shape or form that facilitates or allows mounting the body within or proximate to its associated electrical device. Acceptable shapes include, but are not limited to, squares, triangles, pyramids, ovals, circles, and spheres.

In the FIGS. 1A-1C example, body 110 is comprised of plastic. Alternatively, the body may be comprised of any suitable material now known or later developed suitable for comprising electrical component bodies. Suitable materials include, but are not limited to, wood, rubber, grounded metals, carbon fiber, and composites, or a combination of the foregoing.

As shown in FIGS. 1A-1C, first protrusion 112 comprises one edge of body 110. First protrusion 112 is configured to facilitate or allow placing and selectively retaining body 110 in receiver 130.

In the FIGS. 1A-1C example, first protrusion 112 is configured as a planar shelf. Alternatively, the first protrusion may be configured in any shape or form that facilitates or allows placing and retaining the body in the receiver. Acceptable first protrusion configurations include, but are not limited to, pins, posts hooks, tabs, lips, and beveled edges.

As shown most clearly in FIGS. 1A-1C and FIG. 3, first protrusion 112 defines one or more recesses 120. Recess 120 is configured to facilitate or allow aligning body 110 with receiver 130. In the FIGS. 1A and 3 examples, recess 120 is singular. Alternatively, multiple recesses may be defined by the first protrusion, as depicted in FIG. 1B with two recesses, and 1C with three recesses. As will be described in greater detail below, one or more recesses interface with corresponding alignment elements 133 in receiver 130. The number of recesses 120 present on body 110 can be made unique to the nature and specifications of body 110, and thus the unique power requirements of the associated electrical device. Recesses 120 can also be equipped with a conductive surface to interface with a corresponding conductive surface on alignment elements 133, thereby allowing recesses 120 to double as electrical contacts for electrical component 100 in addition to, or in lieu of, one or more one or more electrical contacts 118.

It will be appreciated by a person skilled in the relevant art that unique arrangement of the one or more recesses 120 and corresponding alignment elements 133 can allow for a keying between body 110 and receiver 130, such that only certain bodies 110 will successfully fit into receiver 130. Thus, by providing a pattern of recesses 120 and alignment elements 133 that is unique to a particular type of electrical power component 100, the installation of an electrical component 100 that is improper for the associated electrical device can be prevent. For example, the number of recesses 120 can correspond to the rated line voltage of the electrical component 100, where a single recess 120 is provided for electrical components 100 that accept 110-120 VAC, and two recesses 120 correspond to an electrical component 100 rated for 220-240 VAC. Thus, an electrical component 100 rated for 110-120 VAC will not interface with a receiver 130 connected to an electrical device that is designed for 220-240 VAC, which would likely cause an electrical component 100 rated for 110-120 VAC to fail or burn out.

Also possible is a pattern that allows for universal installation, as shown in FIG. 1C. As body 110 in FIG. 1C is equipped with three recesses 120, the body 110 depicted in FIG. 1C can be installed in a receiver 130 that has a single centrally located alignment element 133, or two alignment elements 133 spaced on either side of receiver 130. Where the pattern of recesses 120 and alignment elements 133 denote acceptable line voltage, such an arrangement may be used where electrical component 100 can be made to accept a wide range of line voltages, such as from 110 VAC to 240 VAC.

Similarly, where electrical component 100 is a power supply, such as for a network component or LED fixture, a unique pattern of recesses 120 and alignment elements 133 specific to an electrical component 100 that has the correct power specifications for the associated network component or LED fixture can be created. This unique pattern can prevent the installation of an electrical component 100 that does not provide power within appropriate specifications for the associated device, which could cause damage to the associated device.

It will be understood by a person skilled in the relevant art that similar keying can also be accomplished with the shape of body 110 relative to receiver 130. For example, by giving body 110 a unique shape and/or size associated with the characteristics of electrical component 100, body 110 can be limited to be attached only to receivers 130 that are attached to devices designed to accept the power output by electrical component 100. A combination of shapes of body 110 and recesses 120 could also be employed to separate electrical components 100 by type (e.g. ballast, power supply) as well as rated line voltage. However, a person skilled in the relevant art will recognize that recesses 120 can be used to designate any unique characteristic of electrical component 100, not just rated line voltage.

Figures 3, 5, 6:
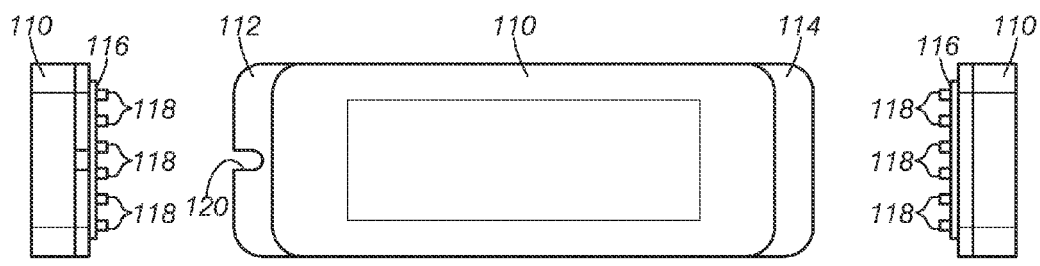
FIG. 3 is a top elevation view of the quick-mount electrical component body shown in FIG. 1A depicting a recess on a first protrusion.
FIG. 5 is a left end elevation view of the quick-mount electrical component body shown in FIG. 1A depicting the first protrusion.
FIG. 6 is a right end elevation view of the quick-mount electrical component body shown in FIG. 1A depicting a second protrusion distal the first protrusion.
Figure 4:
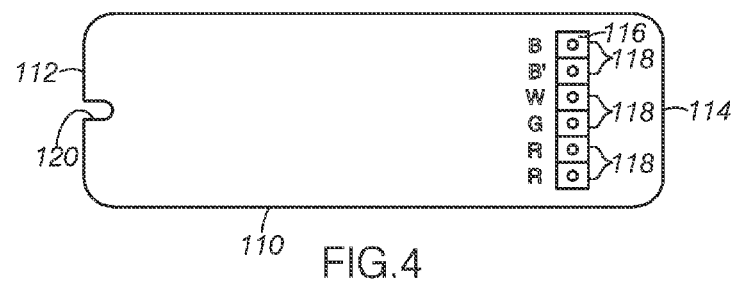
FIG. 4 is a bottom elevation view of the quick-mount electrical component body shown in FIG. 1A depicting a primary plurality of electrical contacts.

Also shown in FIG. 3, second protrusion 114 comprises a second edge of body 110 distal from first protrusion 112. Second protrusion 114 is configured to facilitate or allow placing and selectively retaining body 110 in receiver 130.

In the FIG. 3 example, second protrusion 114 is configured as a planar shelf. Alternatively, the second protrusion may be configured in any shape or form that facilitates or allows placing and selectively retaining the body in the receiver, as well as possibly keying electrical component 100 to its unique characteristics, as described above.

Figure 2:
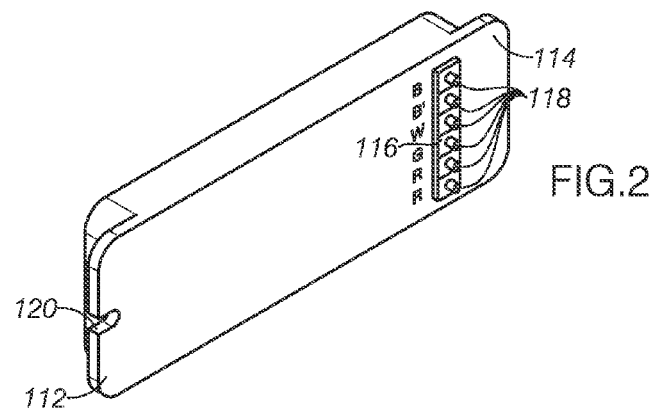
FIG. 2 is a bottom perspective view of the quick-mount electrical component body shown in FIG. 1A depicting a connecting portion.

As shown in FIG. 2, connecting portion 116 is distal from first protrusion 112 and proximate to second protrusion 114. In the FIG. 2 example, connecting portion 116 extends transverse a bottom surface of body 110. Alternatively, the connecting portion may be arranged in any manner that facilitates or allows connecting the body to the receiver.

Also shown in FIG. 2, connecting portion 116 contains a one or more electrical contacts 118. One or more electrical contacts 118 are in electrical communication with the internal electrical circuit (not shown).

In the FIG. 2 example, the one or more electrical contacts 118 are male pin-type contacts. Additionally or alternatively, the one or more electrical contacts 118 may be male electrical contacts, or a combination of male and female electrical contacts. Also, the shape of electrical contacts 118 can be varied from the pin-type to any other suitable contact that provides a reliable electrical connection. Furthermore, the one or more electrical contacts 118 can be implemented in several different contact types on a single body 110, further to the idea of making body 110 fit uniquely only to certain correct receivers 130.

As can be seen in FIGS. 7A-15, receiver 130 includes a guide 132, one or more alignment elements 133, a receiving portion 134, a second set of one or more electrical contacts 135 that complimentarily connect with corresponding one or more electrical contacts 118, a wire trap 136, a visual indicator 137, one or more receptacles 138, a retainer 140, a cavity 150, mounting elements 160, and internal wiring 170. Receiver 130 is complimentarily configured with body 110.

Figure 9:
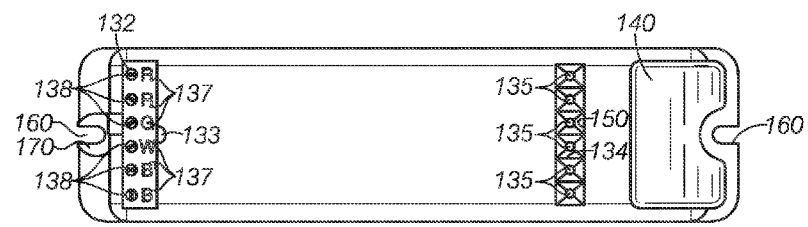
FIG. 9 is a top elevation view of the quick-mount electrical component receiver shown in FIG. 7A depicting a plurality of receptacles on a wire trap, and also depicting a grounding contact integrated into one of the mounting points.

As shown in FIG. 9, receiver 130 is substantially planar and rectangular. Alternatively, the receiver may be configured in any shape or form that facilitates or allows receiving and selectively retaining the body within or proximate to an associated electrical device. Acceptable shapes include, but are not limited to, squares, triangles, ovals, and circles. Acceptable forms include, but are not limited to, rails, tension brackets, and frames.

In the FIG. 9 example, receiver 130 is comprised of plastic. Alternatively, the receiver may be comprised of any suitable material now known or later developed suitable for receivers. Suitable receiver materials include, but are not limited to, wood, rubber, grounded metals, carbon fiber, and composites. Receiver 130 may also be equipped with a ground contact 170 that is integrated with at least one mounting element 160. Ground contact 170 can be electrically connected to the body of receiver 130, particularly if receiver 130 is comprised of a conductive material, and further can provide grounding for body 110. If the housing of body 110 is comprised of a conductive material, grounding to ground contact 170 through receiver 130 can be accomplished merely by the direct contact of the conductive material of body 110 with the conductive material of receiver 130 when body 110 is installed into receiver 130. Ground contact 170 may be integral with receiver 130, or may be supplied as an insert of different conductive material such as copper, iron, carbon, or another similarly suitable conductive material. Where receiver 130 is comprised of a nonconductive material such as plastic, ground contact 170 can be wired to interface with body 110 via receiving portion 134, either first or second protrusions 112, 114, or via one or more recesses 120 that interface via alignment elements 133, where recesses 120 and alignment elements 133 are comprised of conductive material.

Figure 7A:
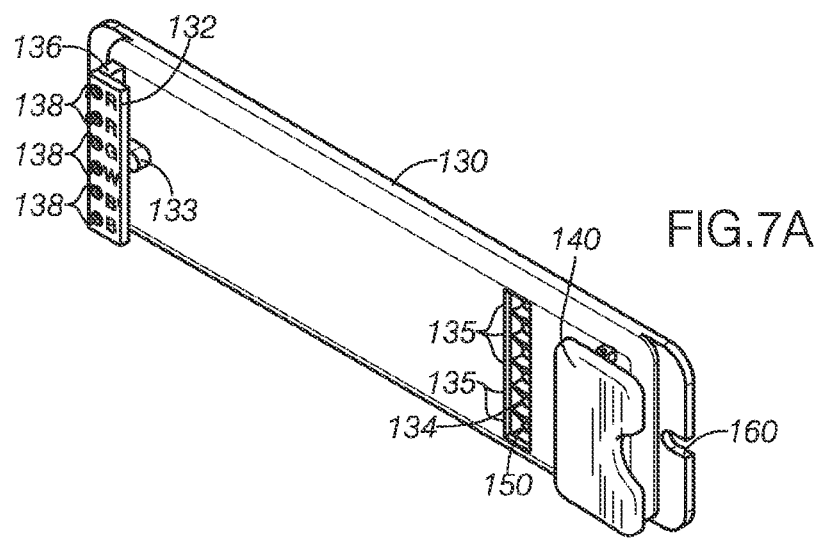
FIG. 7A is a top perspective view of a first example of a quick-mount electrical component receiver, configured to receive the quick-mount electrical component body shown in FIG. 1A.
Figure 7B:
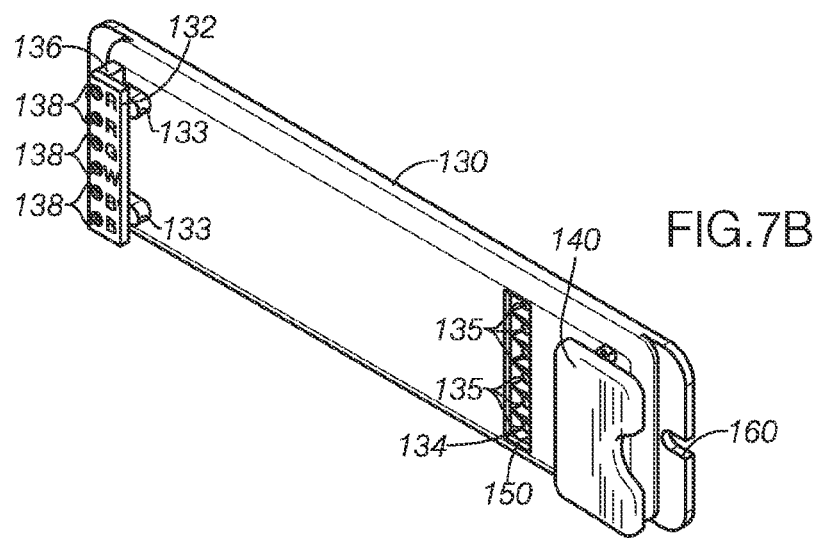
FIG. 7B is a top perspective view of a first example of a quick-mount electrical component receiver, configured to receive the quick-mount electrical component body shown in FIG. 1B.
Figure 7C:
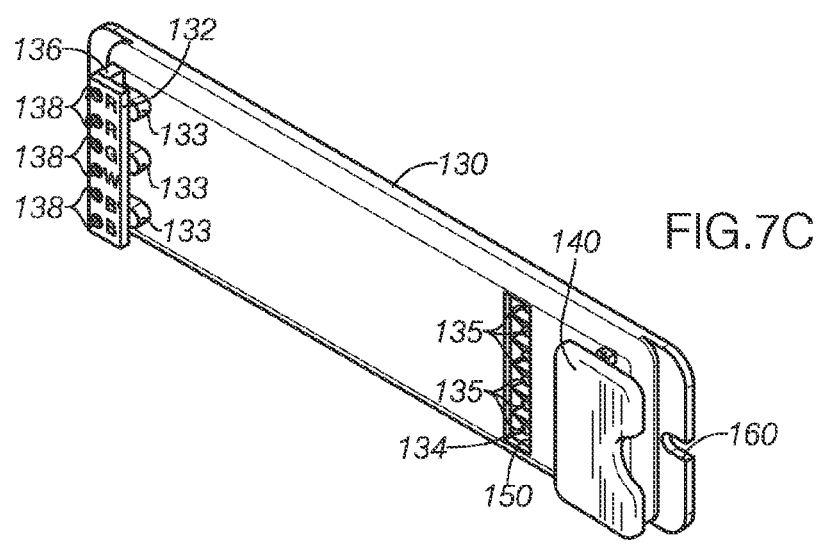
FIG. 7C is a top perspective view of a first example of a quick-mount electrical component receiver, configured to receive the quick-mount electrical component body shown in FIG. 1C.

As shown in FIGS. 7A-7C, guide 132 facilitates or allows aligning and selectively retaining body 110 in receiver 130. Guide 132 is complimentarily configured with first protrusion 112.

Figure 14:
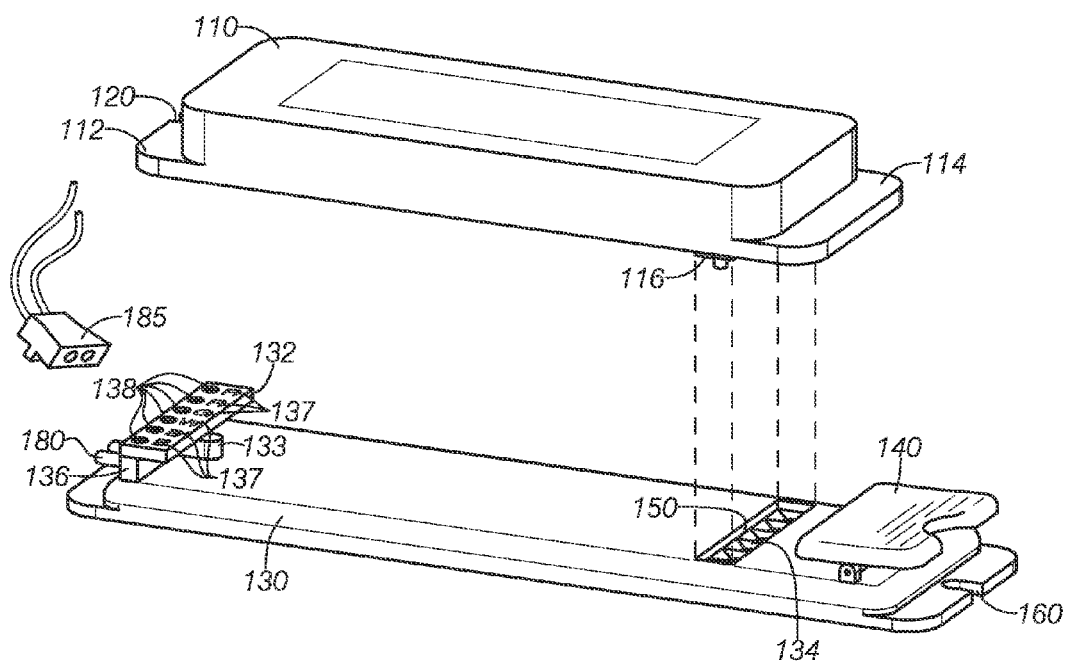
FIG. 14 is a side perspective view of the quick-mount electrical component body shown in FIG. 1A and the quick-mount electrical component receiver shown in FIG. 7A depicting a complimentary configuration between the body and the receiver, as well as an additional quick-connect plug and corresponding receiver contacts.

As shown in FIG. 14, guide 132 retains first protrusion 112 via a friction fit. Alternatively, the guide may align and retain the first protrusion by any now known or later developed mechanism including, but not limited to, clasps, pins, posts, rails, and clips.

As shown most clearly in FIGS. 7A-7C, guide 132 includes one or more alignment elements 133; alignment elements 133 facilitate or allow aligning and selectively retaining body 110 in receiver 130. Alignment elements 133 are complimentarily configured with one or more recesses 120. As described in detail above, alignment elements 133 and recesses 120 can cooperate to provide a keying system whereby only certain electrical components 100 that are appropriate to the associated electrical device can be installed into receiver 130. FIG. 7A depicts a receiver 130 with a single alignment element 133 that will accept a body 110 as depicted in FIG. 1A or FIG. 1C. FIG. 7B depicts a receiver 130 with two alignment elements 133 to accept a body 110 as depicted in FIG. 1B or FIG. 1C. FIG. 7C depicts a receiver 130 with three alignment elements 133 to accept a body 110 as depicted in FIG. 1C only, where a body 110 with three recesses 120 is used for other than an electrical component 100 capable of accepting universal voltages.

In the FIGS. 7A-7C example, alignment element 133 is rigid. Alternatively, the alignment element may be configured in any shape or form that facilitates or allows aligning and selectively retaining the body in the receiver. For example, the alignment element may be spring-loaded or pivoting.

As shown in FIGS. 7A-7C, receiving portion 134 is distal guide 132. Receiving portion 134 is complimentarily configured with connecting portion 116. Receiving portion 134 facilitates or allows aligning and retaining body 110 in receiver 130.

As can be seen in FIGS. 7A-7C, receiving portion 134 is contained within cavity 150. Cavity 150 facilitates or allows aligning and retaining body 110 in receiver 130. Cavity 150 is configured to receive and selectively retain connecting portion 116.

Figure 8:
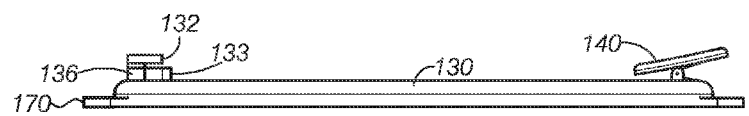
FIG. 8 is a side elevation view of the quick-mount electrical component receiver shown in FIG. 7A depicting a retainer distal from a guide.

As shown in FIGS. 8 and 14, receiving portion 134 contains one or more electrical contacts 135. One or more electrical contacts 135 are complimentarily configured with one or more electrical contacts 118 located on body 110. In other words, connecting one or more electrical contacts 118 with complimentarily configured one or more electrical contacts 135 completes an electrical circuit to form a functioning quick-mount electrical component 100 (depicted in FIG. 15). Conversely, disconnecting one or more electrical contacts 118 from complimentarily configured one or more electrical contacts 135 interrupts or breaks the electrical circuit.

In the FIG. 8 example, one or more electrical contacts 135 are female contacts, arranged to accept the male pin configuration of one or more electrical contacts 118. Additionally or alternatively, one or more electrical contacts 135 on receiver 130 may be male electrical contacts, or a combination of male and female electrical contacts, and like one or more electrical contacts 118, can be of any configuration and shape appropriate to creating a reliable electrical connection between body 110 and receiver 130.

As shown most clearly in FIG. 9, one or more electrical contacts 135 are in electrical communication with internal wiring 170. Likewise, internal wiring 170 is in electrical communication with wire trap 136. Thus, one or more electrical contacts 135 are in electrical communication with wire trap 136.

As shown in FIGS. 8 and 9, wire trap 136 is integrated within guide 132. Wire trap 136 facilitates or allows connecting receiver 130 to the electrical wires (not shown) of the associated electrical device (not shown).

As can be seen in FIG. 8, wire trap 136 includes one or more receptacles 138. One or more receptacles 138 facilitate or allow connecting the electrical wires (not shown) of the associated electrical device (not shown) to receiver 130.

In the FIG. 8 example, one or more receptacles 138 are threaded post receptacles. Alternatively, any now known or later developed mechanism may be used to connect the wires of the associated electrical device to the receiver. Connecting mechanisms include, but are not limited to, modular connectors, wire-to-board connectors, molex® connectors, pressure-fit, or push-in style as commonly employed in electrical fixtures such as sockets and light switches.

As shown most clearly in FIG. 8, guide 132 includes visual indicator 137. Visual indicator 137 facilitates or allows proper wiring of the associated electrical device to plurality of receptacles 138. In other words, visual indicator 137 facilitates or allows proper wiring of receiver 130, enabling quick-mount electrical component 100 to supply power appropriate to the associated electrical device.

Also shown in FIG. 8, retainer 140 is proximate to receiving portion 134 and distal from guide 132. Retainer 140 facilitates or allows selectively retaining body 110 in receiver 130.

In the FIG. 8 example, retainer 140 is a thumb latch. More specifically, retainer 140 is a spring-biased thumb latch. Alternatively, the retainer may be configured as any now known or later developed retaining mechanism including, but not limited to, friction tabs, buttons, clamps, clips, and hook-and-pile systems.

Figure 10:
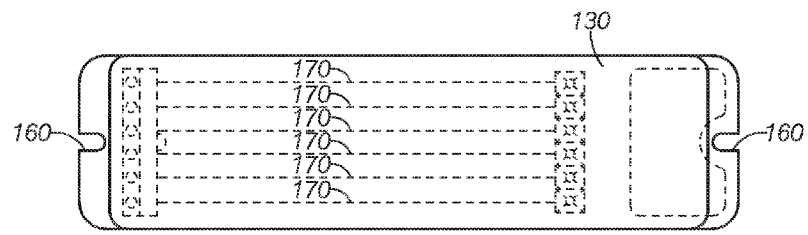
FIG. 10 is an internal view of the quick-mount electrical component receiver shown in FIG. 7A depicting internal wiring connecting the wire trap with a secondary plurality of electrical contacts.
Figures 11, 12, 13:
FIG. 11 is a bottom elevation view of the quick-mount electrical component receiver shown in FIG. 7A depicting mounting elements on opposite ends of the receiver.
FIG. 12 is a left end elevation of the quick-mount electrical component receiver shown in FIG. 7A depicting a mounting element.
FIG. 13 is a right end elevation of the quick-mount electrical component receiver shown in FIG. 7A depicting a thumb-latch retainer.

As shown in FIG. 10, mounting elements 160 facilitate or allow mounting receiver 130 within or near the associated electrical device. In the FIG. 10 example, mounting elements 160 are recesses in the receiver wall sized and configured to accommodate conventional screws (not shown). Alternative mounting elements include, but are not limited to, cavities, windows, and tabs.

Figure 15:
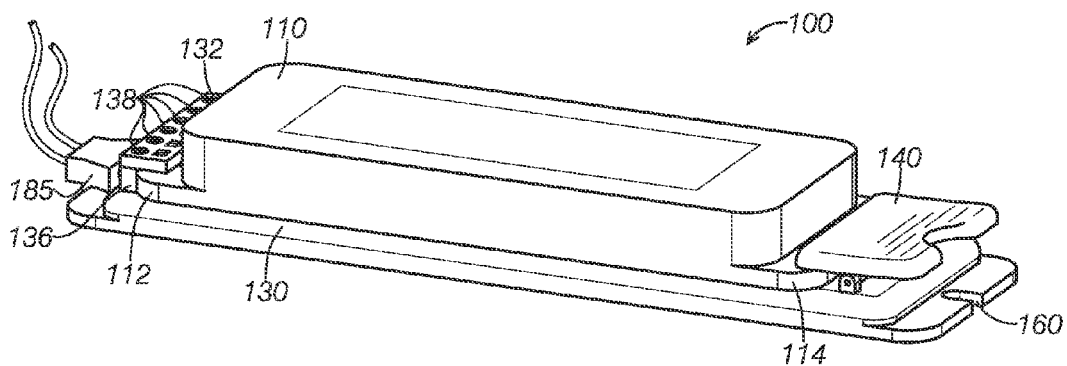
FIG. 15 is a side perspective view of the quick-mount electrical component body shown in FIG. 1A and the quick-mount electrical component receiver shown in FIG. 7A depicting the body retained in the receiver to comprise a quick-mount electrical component, and the quick-connect plug engaged with contacts on the receiver.

Also shown in FIGS. 14 and 15 is an additional electrical connection mechanism comprised of receiving pins 180 and associated plug 185. Plug 185 can be used to enable additional electrical contacts, or can be used to separate out incoming power from connections to the associated electrical device being powered by electrical component 100. For example, plug 185 may carry the hot and neutral wires, while receptacles 138 provide power from electrical component 100 to the associated electrical device. In this way, instead of power both coming into and leaving from receptacles 138, incoming line power is separate and flows through receiving pins 180, which are in turn connected to one or more electrical contacts 135 for connection to one or more electrical contacts 118. By pulling plug 185 from receiving pins 180, receiver 130 and body 110 are de-energized, which makes replacement of body 110 safer, and also allows for quick replacement of receiver 130 should any of the internal connections fail or one or more electrical contacts 135 become worn.

While receiving pins 180 and associated plug 185 are depicted as a series of male pins to a female receiver, a person skilled in the relevant art will understand that this is only one possible configuration of receiving pins 180 and associated plug 185. Receiving pins 180 can be any number of connectors, of the same or a mixture of types suitable to providing a reliable electrical connection. Associated plug 185 is designed to complimentarily fit to receiving pins 180. Associated plug 185 and receiving pins 180 are preferably configured in a keyed fashion, so that associated plug 185 can only be connected to receiving pins 180 in one direction, so as to prevent misconnecting electrical component 100. Furthermore, although FIGS. 14 and 15 depict receiving pins 180 located proximate to the wire trap and receptacles 138, receiving pins 180 can be located anywhere upon receiver 130 so long as the placement does not interfere with the installation of body 110.

Turning attention to FIGS. 16-29, a second example of a quick-mount electrical component, quick-mount electrical component 200, will now be described. Quick-mount electrical component 200 includes many similar or identical features to quick-mount electrical component 200. Thus, for the sake of brevity, each feature of quick-mount electrical component 200 will not be redundantly explained. Rather, key distinctions between quick-mount electrical component 200 and quick-mount electrical component 100 will be described in detail and the reader should reference the discussion above for features substantially similar between the two quick-mount electrical components.

As can be seen in FIGS. 16-29, quick-mount electrical component 200 includes a body 210, a connection portion 212, a protrusion 214, a first set of one or more electrical contacts 218, a series of depressions 225, a receiver 230, a receiving portion 234, a second set of one or more electrical contacts 235, a wire trap 236, a plurality of receptacles 238, a retainer 240, and mounting elements 260.

Quick-mount electrical component 200 differs from quick-mount electrical component 100 through the connecting mechanism between body 210 and receiver 230. Additionally, wire trap 236 is proximate to and in electrical communication with secondary plurality of electrical contacts 235 in this quick-mount electrical component example; receiver 230 lacks internal wiring found in receiver 130.

As shown in FIG. 16, connecting portion 212 comprises one end of body 210. In the FIG. 16 example, connecting portion 212 is configured as a planar shelf. Alternatively, the connecting portion may be configured in any shape or form that facilitates or allows placing and selectively retaining the body in the receiver. Acceptable connecting portion configurations include, but are not limited to, pins, posts hooks, tabs, lips, and beveled edges.

Also shown in FIG. 16, connecting portion 212 defines a series of depressions 225. Series of depressions 225 are integrally formed with a leading edge of connecting portion 212. Alternatively, the connecting portion may define any now known or later developed structure or void suitable for connecting the body to the receiver.

As shown in FIG. 16, series of depressions 225 contain a first set of one or more electrical contacts 218. First set of one or more electrical contacts 218 are proximate the leading edge of connecting portion 212. Additionally, first set of one or more electrical contacts 218 are in electrical communication with an internal electrical circuit (not shown) contained within body 210.

In the FIG. 16 example, first set of one or more electrical contacts 218 are male pin contacts. Additionally or alternatively, the primary plurality of electrical contacts may be female electrical contacts, or a combination of male and female electrical contacts. As disclosed above with reference to the description of electrical component 100, the contacts can be of any configuration suitable to provide a reliable electrical connection, and can be of multiple types on a single electrical component 200.

Figure 28:
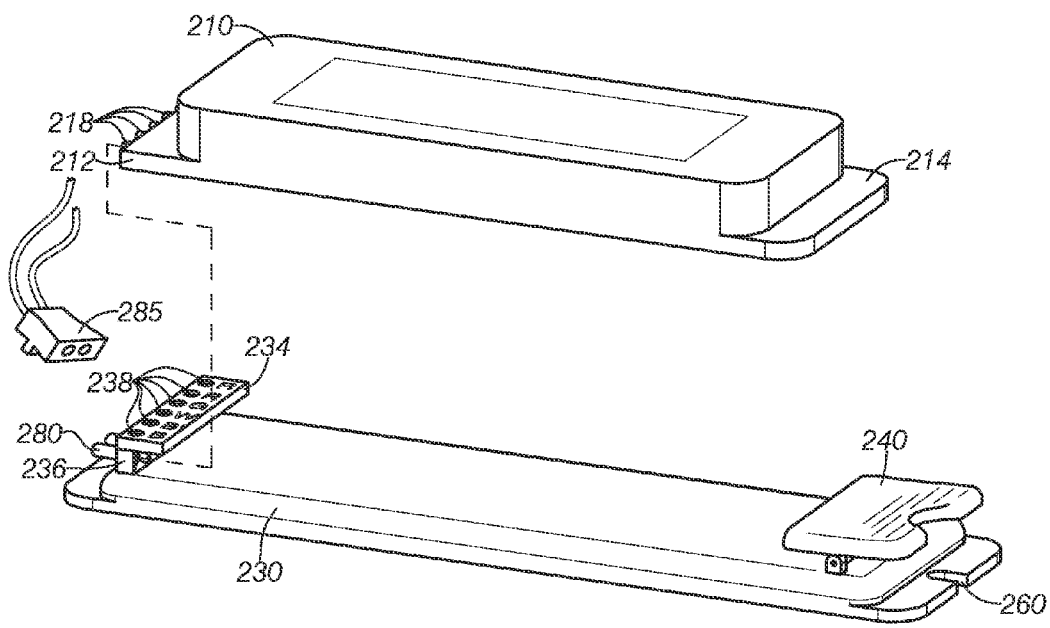
FIG. 28 is a side perspective view of the quick-mount electrical component body shown in FIG. 16 and the quick-mount electrical component receiver shown in FIG. 22 depicting a complimentary configuration between the body and the receiver, and a quick-connect plug and associated complementary receiver contacts.

As shown most clearly in FIG. 28, receiving portion 234 is configured to receive and selectively retain connecting portion 212. Receiving portion 234 is proximate one end of receiver 230 distal from retainer 240.

As shown in FIG. 28, second set of one or more electrical contacts 235 are integrated within receiving portion 234. Second set of one or more electrical contacts 235 are complimentarily configured with first set of one or more electrical contacts 218 and series of depressions 225. In other words, connecting first set of one or more electrical contacts 218 with second set of one or more electrical contacts 135 completes an electrical circuit to form functional quick-mount electrical component 200 (depicted in FIG. 29). Conversely, disconnecting first set of one or more electrical contacts 218 from second set of one or more electrical contacts 235 interrupts or breaks the electrical circuit.

In the FIG. 28 example, second set of one or more electrical contacts 235 are female contacts. Additionally or alternatively, and as disclosed above with respect to first set of one or more electrical contacts 218, second set of one or more electrical contacts 235 may be male electrical contacts, or a combination of male and female electrical contacts.

Figure 29:
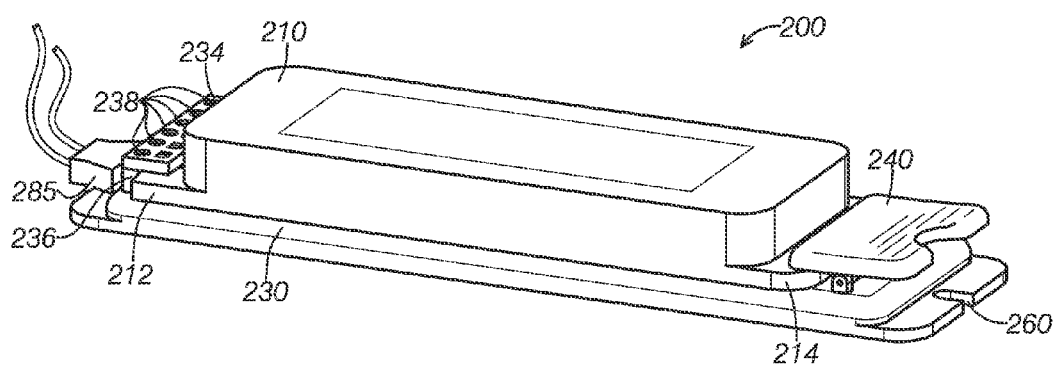
FIG. 29 is a side perspective view of the quick-mount electrical component body shown in FIG. 16 and the quick-mount electrical component receiver shown in FIG. 22 depicting the body retained in the receiver to comprise a quick-mount electrical component, and the quick-connect plug attached to the receiver contacts.

In FIGS. 28 and 29, receiving pins 280 and plug 285 are also depicted. Receiving pins 280 and plug 285 serve the same function and purpose as receiving plug 185 and receiving pins 180 disclosed in connection with electrical component 100.

Figure 22:
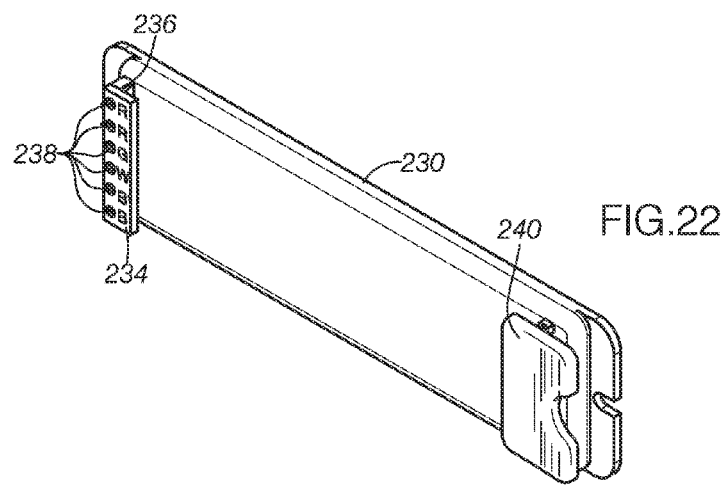
FIG. 22 is a top end perspective view of a second example of a quick-mount electrical component receiver including a receiving portion with an integrated secondary plurality of electrical contacts.
Figure 23:
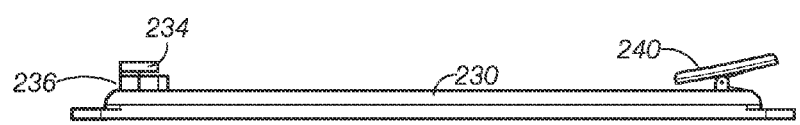
FIG. 23 is a side elevation view of the quick-mount electrical component receiver shown in FIG. 22 depicting a retainer distal from the receiving portion.

As shown in FIG. 22, wire trap 236 is integrated within receiving portion 234. Wire trap 236 is in electrical communication with second set of one or more electrical contacts 235. Wire trap 236 facilitates or allows connecting receiver 230 to electrical wires (not shown) of an associated electrical device (not shown).

Figure 24:
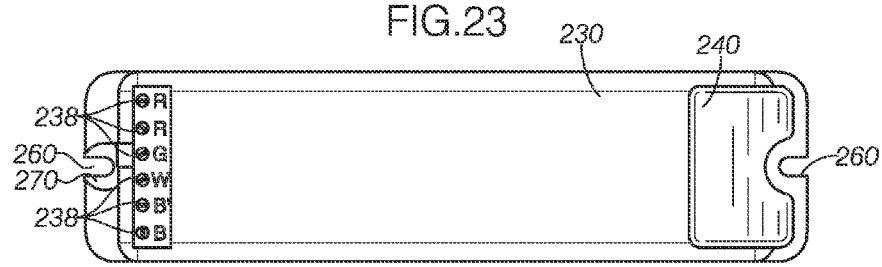
FIG. 24 is a top elevation view of the quick-mount electrical component receiver shown in FIG. 22 depicting a plurality of receptacles on a wire trap, and an integrated grounding contact associated with one of the receiver mounting points.
Figures 25, 26, 27:
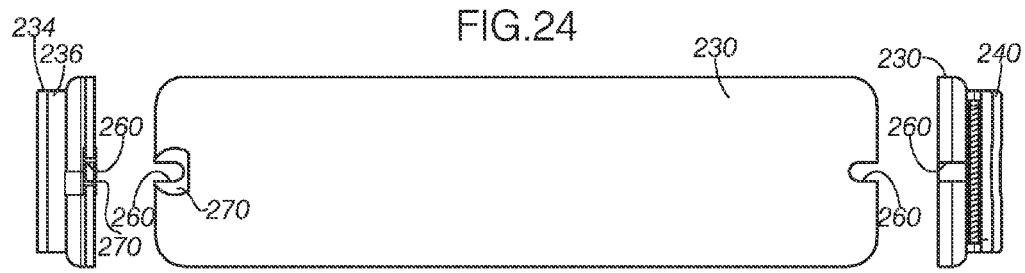
FIG. 25 is a bottom elevation view of the quick-mount electrical component receiver shown in FIG. 24 depicting mounting elements on opposite ends of the receiver.
FIG. 26 is a left end elevation view of the quick-mount electrical component receiver shown in FIG. 24 depicting the receiving portion and integrated wire trap.
FIG. 27 is a right end elevation view of the quick-mount electrical component receiver shown in FIG. 22 depicting a spring-loaded thumb-latch retainer.

As shown in FIG. 24, wire trap 236 includes plurality of receptacles 238. Plurality of receptacles 238 facilitate or allow properly connecting wire trap 236 to electrical wires (not shown) of an associated electrical component (not shown).

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A quick-mount system for electrical components, comprising:
   a body including:
      a first protrusion;
      a connecting portion distal the first protrusion, the connecting portion containing at least one electrical contact; and
      a second protrusion proximate the connecting portion; and
   a receiver including:
      a guide;
      a wire trap proximate the guide;
      at least one electrical contact proximate the guide;
      a receiving portion distal the guide, the receiving portion containing at least one electrical contact corresponding to and complimentarily configured with the at least one electrical contact in the connective portion; and
      a retainer proximate the receiving portion;
   wherein the guide is configured to receive the first protrusion in the guide, the receiving portion is configured to receive the connecting portion, and the retainer is configured to retain the second protrusion, and
   wherein receiving the connecting portion in the receiving portion connects the at least one electrical contact in the connecting portion with the at least one electrical contact in the receiving portion to complete an electrical circuit.

2. The quick-mount system of claim 1, further comprising an electrical circuit, the electrical circuit being in electrical communication with the at least one electrical contact in the connecting portion.

3. The quick-mount system of claim 1, wherein the wire trap includes at least one receptacle for wiring the receiver to an electrical device.

4. The quick-mount system of claim 1, wherein the receiver includes internal wiring connecting the wire trap to the at least one electrical connection in the receiver.

5. The quick-mount system of claim 1, wherein the receiver includes mounting elements for mounting the receiver to a substrate.

6. The quick mount system of claim 5, wherein at least one mounting element includes a grounding contact.

7. The quick-mount system of claim 1, wherein the receiver defines a cavity, the cavity containing the receiving portion.

8. The quick-mount system of claim 1, wherein the guide includes at least one alignment element and a visual indicator depicting a proper wiring sequence of the wire trap.

9. The quick-mount system of claim 8, wherein the first protrusion defines at least one recess complimentarily configured with the at least one alignment element.

10. The quick-mount system of claim 9, wherein the at least one recess is positioned on the body and the at least one alignment element is positioned on the receiver such that the body must have an appropriately positioned at least one recess to install into the receiver.

11. The quick-mount system of claim 1, wherein the receiver further comprises a second one or more electrical contact separate from the at least one electrical contact proximate the guide, shaped so as to receive and electrically connect with a plug.

12. The quick-mount system of claim 1, wherein the body comprises an electrical component for providing power appropriate to an electrical device connected to the receiver.

13. The quick-mount system of claim 12, wherein the electrical component in the body is comprised of a fluorescent light ballast, a metal halide lamp ballast, an arc lamp ballast, an LED power supply, a low-voltage lighting power supply, or an electronic device power supply.

14. A quick-mount electrical component, comprising:
a body including:
a connecting portion containing a first set of one or more electrical contacts;
an internal electrical circuit for providing appropriate power to an electrical device, the internal electrical circuit being in electrical communication with the first set of one or more electrical contacts; and
a protrusion distal the connecting portion; and
a receiver including:
a receiving portion configured to receive the connecting portion, the receiving portion containing a second set of one or more electrical contacts; and
a wire trap integrated within the receiving portion and in electrical communication with the second set of one or more electrical contacts;
a retainer distal the receiving portion, the retainer configured to retain the protrusion;
wherein the first set of one or more electrical contacts are complimentarily configured with the second set of one or more electrical contacts and retaining the connecting portion in the receiving portion connects the first set of one or more electrical contacts with the second set of one or more electrical contacts to complete an electrical circuit.

15. The quick-mount electrical component of claim 14, wherein the internal electrical circuit is comprised of a fluorescent light ballast, a metal halide lamp ballast, an arc lamp ballast, an LED power supply, a low-voltage lighting power supply, or an electronic device power supply.

16. The quick-mount electrical component of claim 14, wherein the connecting portion defines a series of one or more pins that comprise the first set of one or more electrical contacts.

17. The quick-mount electrical component of claim 16, wherein the second set of one or more electrical contacts are one or more recessed contacts complimentarily configured with the series of one or more pins.

18. The quick-mount electrical component of claim 14, wherein the receiver further comprises a second receiving contact that is shaped to receive a plug, the second receiving contact in electrical communication with the second set of one or more electrical contacts.

19. The quick-mount electrical component of claim 14, wherein the retainer is configured to selectively release the protrusion.

20. A quick-mount electrical component, comprising:
a body including:
a first protrusion comprising one or more recesses;
a first set of one or more electrical contacts distal the first protrusion;
an internal electrical circuit for providing appropriate power to an electrical device, the electrical circuit being in electrical communication with the first set of one or more electrical contacts; and
a second protrusion proximate the first set of one or more electrical contacts; and
a receiver including:
a guide configured to receive and align the first protrusion, the guide comprising one or more alignment elements positioned to receive the one or more recesses;
a wire trap integrated within the guide, the wire trap containing a plurality of receptacles configured to connect the receiver to electrical wires of the electrical device;
a cavity distal the guide;
a second set of one or more electrical contacts within the cavity, the second set of one or more electrical contacts complimentarily configured with the first set of one or more electrical contacts and in electrical communication with the wire trap; and
a retainer proximate the second set of one or more electrical contacts, the retainer configured to selectively retain the first set of one or more electrical contacts in contact with the second set of one or more electrical contacts to complete an electrical circuit; and
wherein the position of the one or more recesses and the one or more alignment elements is unique to the body with respect to the electrical device the internal electrical circuit is designed to power, such that the first protrusion on a body with an internal electrical circuit not designed to provide appropriate power for the electrical device will not fit within the guide.

* * * * *